United States Patent [19]

Kordina et al.

[11] Patent Number: 5,695,567
[45] Date of Patent: Dec. 9, 1997

[54] SUSCEPTOR FOR A DEVICE FOR EPITAXIALLY GROWING OBJECTS AND SUCH A DEVICE

[75] Inventors: Olle Kordina, Sturefors; Jan-Olov Fornell, Malmö; Rune Berge; Roger Nilsson, both of Lund, all of Sweden

[73] Assignee: ABB Research Ltd., Zurich, Switzerland

[21] Appl. No.: 616,575

[22] Filed: Mar. 15, 1996

[51] Int. Cl.$^6$ .................................................. C23C 16/00
[52] U.S. Cl. .................................... 118/725; 219/634
[58] Field of Search .......................... 118/725, 715; 219/634

[56] References Cited

U.S. PATENT DOCUMENTS

| | | | |
|---|---|---|---|
| 3,095,494 | 6/1963 | Denton | 118/715 |
| 3,098,763 | 7/1963 | Deal | 118/49.5 |
| 3,138,435 | 6/1964 | Diefendorf | 118/715 |
| 3,282,814 | 11/1966 | Berghaus | 118/715 |
| 3,304,908 | 2/1967 | Gutsche | 118/725 |
| 3,372,671 | 3/1968 | Chu | 118/49.5 |
| 4,147,571 | 4/1979 | Stringfellow | 148/175 |
| 4,263,872 | 4/1981 | Ban | 118/721 |
| 4,339,645 | 7/1982 | Miller | 219/10.49 R |
| 4,421,592 | 12/1983 | Shuskus | 156/613 |
| 4,421,786 | 12/1983 | Mahajan | 427/82 |
| 4,805,556 | 2/1989 | Hagan | 118/725 |
| 4,920,918 | 5/1990 | Adams | 118/724 |
| 5,119,540 | 6/1992 | Kong | 29/25.01 |
| 5,136,975 | 8/1992 | Bartholomew | 118/715 |
| 5,194,406 | 3/1993 | Bok | 437/225 |

FOREIGN PATENT DOCUMENTS

| | | |
|---|---|---|
| 0 181 624 | 5/1986 | European Pat. Off. |
| 0 269 439 | 6/1988 | European Pat. Off. |
| 0 519 608 | 12/1992 | European Pat. Off. |

OTHER PUBLICATIONS

Kordina, Growth And Characterisation of Silicon Carbide Power Device Material, Paper I, pp. 47–59, Linkoping Studies in Science and Technology, Dissertations No. 352, Department of Physics and Measurement Technology, Linkoping University, Sweden, 1994.

*Primary Examiner*—Richard Bueker
*Assistant Examiner*—Jeffrie R. Lund
*Attorney, Agent, or Firm*—Pollock, Vande Sande & Priddy

[57] ABSTRACT

A susceptor for a device for epitaxially growing objects made of one of SiC, a Group 3B-nitride and alloys thereof on a substrate to be received in the susceptor, includes plurality of separate susceptor wall pieces defining a top wall, a bottom wall and lateral walls. The wall pieces are made of a material which may be heated by induction and are secured to each other to form the susceptor. A channel is defined by susceptor walls adapted to receive the substrate and through which a source material for the growth is to be fed. At least one SiC-plate is inserted to cover at least one of the top and bottom walls and to extend between and separate the lateral walls and the at least one of the top and bottom walls.

12 Claims, 3 Drawing Sheets

SUSCEPTOR FOR A DEVICE FOR EPITAXIALLY GROWING OBJECTS AND SUCH A DEVICE

TECHNICAL FIELD

The present invention relates to a susceptor for a device for epitaxially growing objects of one of a) SiC, b) a Group 3B-nitride or c) alloys thereof, on a substrate to be received in the susceptor, the susceptor having a channel adapted to receive the substrate and through which a source material for the growth is intended to be fed, the walls of the susceptor surrounding the channel being made of a material which may be heated by induction created by heating means intended to surround the susceptor. The invention also relates to a device for epitaxially growing such objects.

Accordingly, the invention is applicable to the growth of SiC, Group 3B-nitrides, and all types of alloys thereof, but the common problem of growing such crystals of a high quality will now, by way of a non-limitative example, be further explained for SiC.

High temperatures are needed to obtain a well ordered growth of SiC-crystals and different growth techniques are conceivable and are within the scope of the present invention. However, the Chemical Vapor Deposition (CVD) is the most used for growing epitaxial layers of SiC for in particular, power device applications, so that this technique will hereinafter be discussed for illustrating the problem to be solved by the invention. In the Chemical Vapor Deposition case the source material for the growth is present in the form of precursor gases, normally silane and propane. Heating to temperatures in excess of 1 400° C. is needed both to obtain decomposition by cracking of these Si- and C-containing precursor gases and to ensure that the atoms are deposited on the substrate surface in an ordered manner. High temperatures also cause problems with impurities coming out of different types of material, so that the selection of a suitable material withstanding the high temperature is crucial in order to prevent unwanted impurities from being incorporated in the layers of the SiC crystal grown.

To prevent this, it is common practise to coat the susceptor walls, which normally are made of graphite, with a SiC layer. Furthermore, a susceptor of the type described in the introduction is a so called hot-wall type susceptor in which the walls surrounding a channel receiving the substrate are heated, and through which a substantially uniform temperature may be achieved in the susceptor, resulting in only small temperature gradients, which is favorable to the quality of the crystal grown on the substrate. Also, at these temperatures, a difference in temperature between different wall parts surrounding the channel in the order of 15°–20° K. will result in a remarkable difference of the crystalline quality of the object grown as compared with the case of temperature uniformity. A susceptor of this type also provides a higher temperature in the gas phase than a so called cold-wall susceptor, and thereby causes the cracking efficiency and all chemical reactions to be raised. This may cause a problem with depletion of the precursor gases; however, due to the geometry and the expansion of the gas when it is heated, the velocity is very high, which improves the uniformity of the grown layers. It is also disclosed in Swedish patent application No. 9500326-5 corresponding to U.S. patent application Ser. No. 08/421,879 of the applicant to place a plate of SiC in the susceptor between the susceptor and the substrate to solve the problem that the SiC coating underneath the substrate will be etched or sublimed and deposited on the backside of the somewhat cooler substrate, which will limit the lifetime of the susceptor.

A hot-wall type susceptor as described in the Swedish patent application ensures the growth of epitaxial layers of SiC with a very high crystalline quality to high thicknesses with low impurity incorporation and long carrier lifetimes. However, this type of prior art susceptor is also associated with some problems. One of them is the difficulty to produce a hot-wall susceptor with a channel surrounded by thick walls. The production thereof is carried out by material removal from one blank by a milling operation, which however is difficult, especially for long susceptor tubes, or spark machining, which is delicate to use when the blank is made of graphite, which mostly is the case, for creating the channel. Furthermore, the parts of the susceptor which are thinner than other parts will be slightly hotter than the other parts, so that so called "hot spots" are created there resulting in a more severe etching there than on other parts of the susceptor. Thus, the SiC coating will thereby be removed after a certain operation time of the susceptor, for example after approximately 300 hours, which may cause a disturbance on the growing layers if these lie close to the exposed graphite or other material used for the walls of the susceptor and thus limit the lifetime of the susceptor to the point when this takes place.

SUMMARY OF THE INVENTION

The object of the present invention is to provide a susceptor and a device of the type defined in the introduction, through which the problems of the prior art hot-wall type susceptor mentioned above may be solved.

This object is, in accordance with the invention, obtained by making the susceptor defined above of at least two separate susceptor wall pieces and providing it with means for securing the wall pieces of the susceptor to each other for forming the susceptor. The split of the susceptor into at least two separate parts makes the machining of the susceptor much simpler, since it will be much easier to produce each such part separately and secure them to each other, for instance by screwing, than the prior art machining, thereby reducing manufacturing costs significantly, especially if large amounts of these susceptors are produced. Another effect of the splitting of the susceptor into several parts is that the electrical resistance will be higher across the interface between two such parts than elsewhere in the walls of the susceptor, so that currents induced by the heating means cannot form the large loops formed in the prior art hot-wall susceptors, where these loops substantially follow the perimeter of the hot-wall susceptor. Instead these loops will have a tendency to stay in one and the same wall piece of the susceptor. As a result, the thinner parts of the susceptor walls will not be as hot as in the prior art constructions, thereby preventing etching due to so called hot-spots, so that the susceptor lifetime may be increased. These two advantages of the susceptor according to the invention considerably lower the costs for producing an object grown in a susceptor of this type.

According to a preferred embodiment of the invention the susceptor is made of at least four separate susceptor wall pieces surrounding the channel, namely two lateral wall pieces, a top wall piece and a bottom wall piece. A susceptor so constructed may be manufactured very easily and at low cost, and the heat profiles of the different pieces may be efficiently controlled so that a substantially uniform temperature may be obtained in substantially the whole susceptor reducing etching of surfaces thereof and by that prolonging the lifetime of the susceptor as well as improving the crystalline quality of the object grown in the susceptor.

According to another preferred embodiment of the invention the securing means comprises screws. Such a susceptor is very easy to manufacture by separate machining of the individual wall pieces of the susceptor and thereafter screwing them together. The securing means are preferably made of the same material as the wall of the susceptor so that for susceptor walls of graphite and securing means in the form of graphite screws are used as securing means. This prevents the introduction of other materials in the susceptor which may influence the growth negatively by releasing new types of impurities, which may be incorporated in the layers grown, or deteriorating the temperature uniformity in the region of the walls of the susceptor where the securing means are arranged.

According to another preferred embodiment of the invention, each of the securing means extends through a lateral wall of the susceptor and the intervals forming the bottom and the top, respectively, of the susceptor channel for securing these walls to each other. Such a construction makes the assembly of the susceptor very simple with a minimum of securing means. "Securing means" is here to be interpreted very broadly and comprises for instance the case where a screw extends from a bottom wall through a lateral wall to a top wall, in which a nut or a threaded recess is arranged and the case where a screw extending from one of the bottom and the top wall into a lateral wall and a sleeve extend from the other of the walls into the lateral wall for attaching them to each other there, and so on. Accordingly, the definition "securing means" is intended to comprise the combination of such members establishing a rigid connection.

According to another preferred embodiment of the invention, the susceptor has at least one wall piece forming one of a) the bottom wall and b) the top wall of the channel and separated from lateral walls of the susceptor and a plate made of one of a) SiC, b) an alloy of SiC and the material grown and c) the material growing is placed on the at least one wall piece for covering thereof and inserted between the lateral walls and the at least one wall piece. As a result of applying a SiC-plate in a so called hot-wall susceptor, the problem of a severe etching of the SiC-coating and the walls of the susceptor close to the edges of the SiC-plate in the prior art susceptors is totally eliminated. This is due to the fact that no such edges of the SiC-plate are thereafter located within the channel of the susceptor. This further increases the lifetime of such a susceptor.

According to another preferred embodiment of the invention, a first plate made of one of a) SiC, b) an alloy and the material grown and c) the material grown, is placed on the bottom wall piece for covering thereof, and inserted between the two lateral wall pieces and the bottom wall piece and a second plate made of one of a) SiC, b) an alloy of SiC and the material grown and c) the material grown, is placed directly under the wall piece for covering thereof and inserted between the lateral wall pieces and the top wall piece. In such a susceptor, both top and the bottom of the susceptor will be efficiently protected against severe etching so that the lifetime of the susceptor will be prolonged further.

According to another preferred embodiment of the invention, the susceptor is provided with at least two channels adapted to receive at least one substrate for the growth of at least one object each, each channel being delimited by two lateral wall pieces, a top wall piece and a bottom wall piece, and a wall piece separating two adjacent channels form a bottom wall piece for one channel and the top wall piece for the other channel. Such a susceptor has the advantages of a simple manufacture procedure and a prolonged lifetime as mentioned above, and in addition thereto the advantage of allowing production of at least two crystals in the same growth run thereby lowering production costs considerably.

According to a further embodiment of the invention constituting a further development of the embodiment last discussed, the first and second plates are placed on the bottom wall pieces and directly under the top wall piece and inserted between two lateral wall pieces, and the respective top and bottom wall piece of each channel in the susceptor. This leads to the advantages mentioned above in the case of such plates arranged in a susceptor with one channel also in a susceptor having at least two channels.

The advantages of the device according to the invention may easily be derived from the discussion above of the preferred embodiments of the present invention susceptor.

Further preferred features and advantages of the susceptor and the device according to the invention will appear from the following description and the other dependent claims.

BRIEF DESCRIPTION OF THE DRAWINGS

With reference to the appended drawings, below follows a specific description of preferred embodiments of the invention cited as examples. In the drawings.

DESCRIPTION OF A PRIOR ART SUSCEPTOR AND DEVICE

Figure 1:
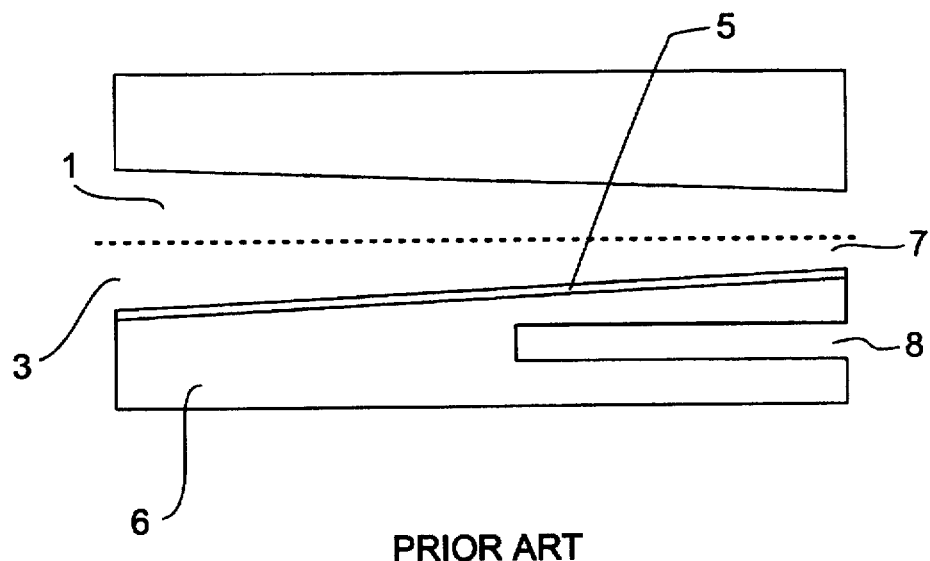
FIG. 1 is a longitudinal cross-sectional view of a susceptor according to the prior art.
Figure 2:
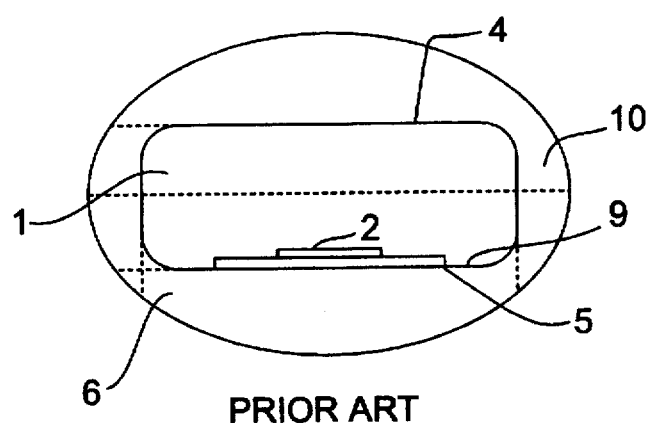
FIG. 2 is an end view from the left of the susceptor according to FIG. 1.
Figure 3:
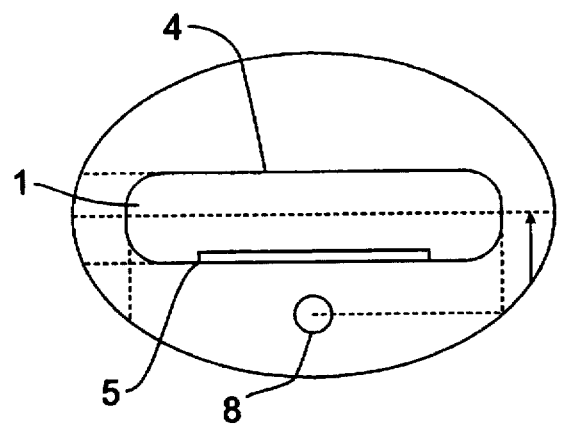
FIG. 3 is an end view from the right of the susceptor according to FIG. 1.

FIGS. 1–3 show a susceptor according to the prior art and of the type described in Swedish patent application 9500326-5 corresponding to U.S. patent application Ser. No. 08/421,879 of the applicant, and this prior art susceptor may briefly be discussed for better understanding of the invention. This susceptor is a so called hot-wall susceptor, i.e. the susceptor walls surrounding a channel 1 therein are to be heated for heating a substrate 2 received in the channel as well as precursor gases introduced into the larger opening 3 of the susceptor for epitaxially growing a SiC crystal on the substrate by Chemical Vapor Deposition. "Walls" is defined as comprising lateral walls as well as the bottom and the top wall pieces surrounding the channel. The susceptor is formed of graphite and is coated by a thin SiC coating 4. A SiC-plate 5 of high crystalline quality is applied on the bottom surface of the channel 1 between the substrate 2 and the bottom part of the wall 6 of the susceptor for solving the problems of sublimation and etching of the SiC-coating 4 below the substrate 2 described in the Swedish patent application. The channel 1 tapers from the inlet opening 3 towards the outlet opening 7 for counteracting a depletion of the precursor gases, which normally are silane and propane, introduced through the opening 3 for the growth by increasing the velocity of these gases slightly deeper in the channel. This means that the stagnant gas layer to be penetrated for deposition on the substrate will be thinner and the growth rate will increase.

A susceptor of this type is used to grow films of a thickness of 20–50 mm for the use primarily in high power semiconductor devices. The gas mixture is led through the channel 1 of the susceptor, the gas mixture containing a $H_2$ carrier gas and C- and Si-containing precursor gases, preferably in the form of propane and silane. Heating means (not shown) heats the susceptor walls 6 so that the substrate will obtain a temperature of 1500°–1700° C., preferably about 1550° C., and the gas mixture introduced into the channel will be heated by dissipation of heat from the susceptor, which results in cracking of the precursor gases for formation of silicon and carbon-atoms which will be deposited onto the surface of the SiC-substrate 2. In the drawings it is also shown that the susceptor has a recess 8 for facilitating the handling of the susceptor during introduction into, and removal out of, the casing in which the growth takes place. It may also be mentioned that typical dimensions for the channel are a length of 100 mm and a width of 50 mm, for the substrate a length and width of about 30 mm and a thickness of 0.3 mm and for the SiC-plate a thickness of approximately 1 mm. These typical dimensions are also applicable for the susceptor according to the preferred embodiments of the invention described below.

This prior art has, however, some disadvantages, one of which is that this production requires a delicate and time consuming machining of a blank of graphite, which makes the manufacturing costs high. Another disadvantage is, as already mentioned, that there will be a severe etching of the SiC coating and graphite of the susceptor in the region 9 close to the edges of the SiC-plate 5. The etching is more severe at these places since the lateral walls 10 of the susceptor are thinner than the other walls of the susceptor and will thus be slightly hotter than the other walls.

DETAILED DESCRIPTION OF PREFERRED EMBODIMENTS

Figure 4:
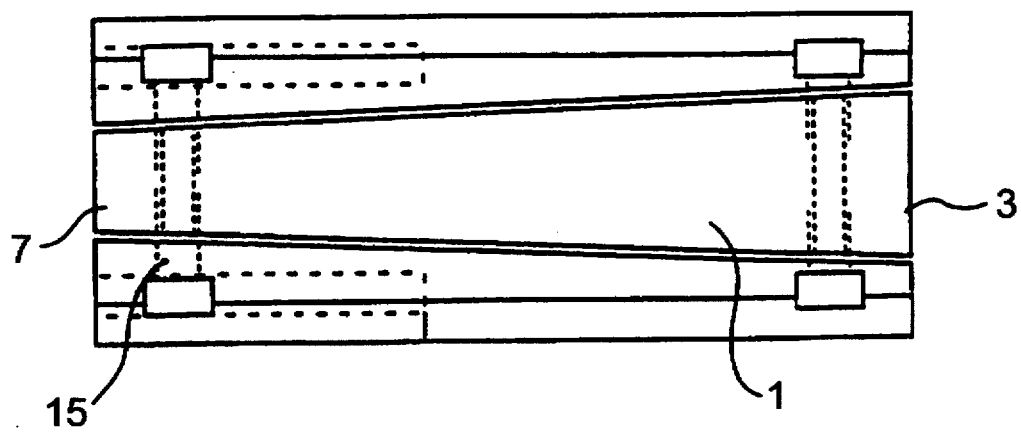
FIG. 4 is a longitudinal cross-section view of a susceptor according to a first preferred embodiment of the invention.
Figure 5:
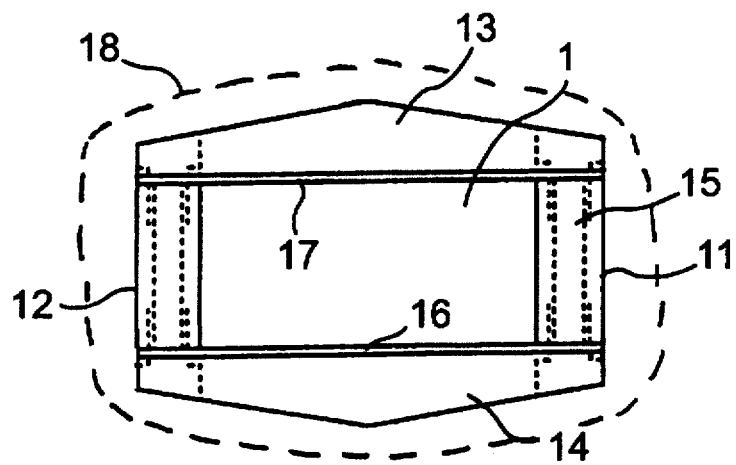
FIG. 5 is an end view from the right of the susceptor according to FIG. 4.
Figure 6:
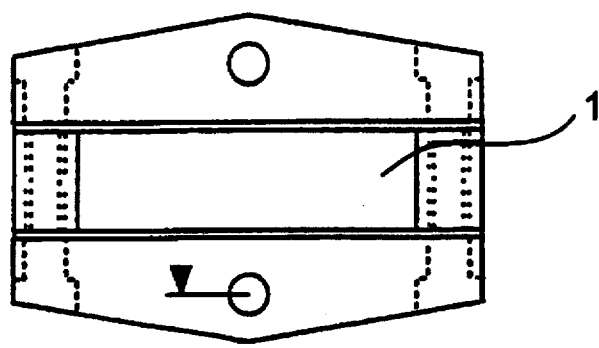
FIG. 6 is an end view from the left of the susceptor according to FIG. 4.

FIGS. 4–6 show schematically a susceptor according to a preferred embodiment of the invention. This susceptor is also a so called hot-wall susceptor, which is formed by four separate wall pieces, namely two lateral wall pieces 11, 12, a top wall piece 13, and a bottom wall piece 14, preferably of graphite and covered by a thin SiC-coating. These wall pieces are secured to each other by screws 15, preferably also of graphite, which extend from the top wall piece 13 to the bottom wall piece 14 through a respective lateral wall piece 11 or 12. A first plate 16 made of SiC is placed on the bottom wall piece 14 for covering thereof and inserted between the two lateral wall pieces 11, 12 and the bottom wall piece 14, while a second plate 17 made of SiC is placed directly under the top wall piece for covering thereof and inserted between two lateral wall pieces 11, 12 and the top wall piece 13. The plates 16, 17 extend through the entire susceptor for separating the different wall pieces 11–14 from each other. It is evident that this susceptor will be easy to produce, since a production of the different wall pieces would be rather simple and it will then be easy to screw together the wall pieces with the SiC-plates therebetween.

A dashed line 18 in FIG. 5 indicates how a heating means may surround the susceptor to create induction currents therein. The heating means 18 is preferably a Rf-field radiating coil. The loops of induction current created by the heating means have a tendency to substantially follow the perimeter of the susceptor in the normal case, but in the present invention the electrical resistance is higher where the walls are divided, so that the current loop induced by the heating means is kept within each wall piece for heating thereof. This means no severe etching occurs due to so called hot spots. The fact that the SiC-plates cover the entire bottom and ceiling of the susceptor channel 1, and that they are inserted between the bottom and top wall piece and the latter wall pieces, means that the edges of the SiC-plates are hidden outside the susceptor channel. As a result, the problem of severe etching close thereto will be eliminated. Thus, the lifetime of the susceptor may be prolonged with respect to prior art susceptors.

Figure 7:
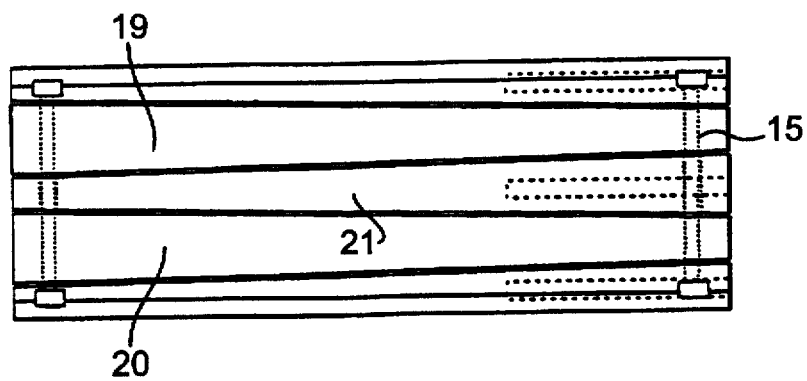
FIG. 7 is a longitudinal cross-section view of a susceptor according to a second preferred embodiment of the invention.
Figure 8:
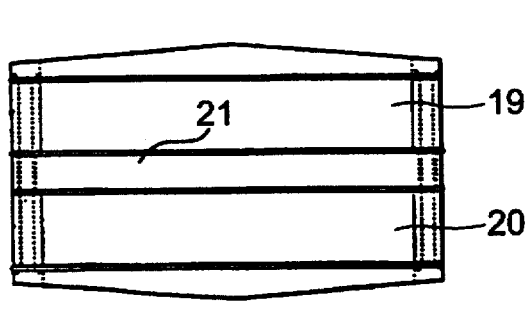
FIG. 8 is an end view from the left of the susceptor according to FIG. 7.
Figure 9:
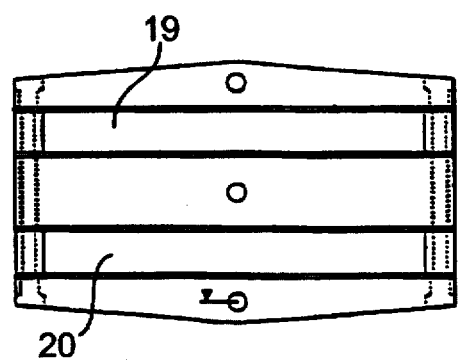
FIG. 9 is an end view from the right of the susceptor according to FIG. 7.

FIGS. 7–9 illustrates schematically a susceptor according to a second preferred embodiment of the invention, which is formed by seven separate wall pieces screwed together by screws 15. This embodiment is also provided with SiC plates 16, 17 of the same type as the embodiment described above. The susceptor created in this way has two channels 19, 20 separated by a central wall piece 21 forming the bottom of the channel 19 and the top of the channel 20. This susceptor has the same principal characteristics and advantages as the susceptor of the first preferred embodiment of the invention and the additional advantage of the possibility to produce at least two crystals in the same growth run.

The invention is of course not in any way restricted to the preferred embodiment of the susceptor and the device described above, but several possibilities of modifications thereof would be apparent to one skilled in the art without departing from the basic idea of the invention.

As already mentioned, the invention is also applicable to the growth of a Group 3B-nitride, an alloy of such Group 3B-nitrides or an alloy of SiC, and one or more Group 3B-nitrides and will lead to the corresponding simplification and prolongation of the lifetime of the susceptor and such a device in the case of growth of such objects.

The substrate may be of another material than SiC, such as Group 3B-nitrides.

Although in the drawings and description show that the susceptor is substantially horizontally orientated, it is readily feasible give the susceptor any other desired orientation in the room.

The definition "object" in the claims is made for including the epitaxial growth of all types of crystals, such as layers of different thicknesses as thick boules.

All definitions concerning the material of course also include inevitable impurities as well as intentional doping.

The securing means may, of course, be other than screws and corresponding threaded bores or nuts.

Furthermore, the susceptor is not required to be formed of graphite; instead tantalum is also conceivable as a material therefore. Preferably, the screws or other securing means are made of the same material as the susceptor walls, so as to avoid the introduction of new types of impurities and facilitate the heating of the walls to obtain the temperature uniformity thereof.

We claim:

1. A susceptor for a device for epitaxially growing objects made of one of SiC, a Group 3B-nitride and alloys thereof on a substrate to be received in the susceptor, said susceptor including:

1) plurality of separate susceptor wall pieces defining a top wall, a bottom wall and lateral walls, said wall pieces being made of a material which may be heated by induction created by heating means;

2) means for securing said wall pieces to each other to form said susceptor;

3) a channel defined by susceptor walls and adapted to receive said substrate and through which a source material for the growth is to be fed; and 4) at least one SiC plate inserted to cover at least one of said top and bottom walls and to extend between and separate said lateral walls and said at least one of said top and bottom walls.

2. A susceptor according to claim 1 wherein the securing means comprises screws.

3. A susceptor according to claim 1, wherein the securing means are made of the same material as the wall pieces of the susceptor.

4. A susceptor according to claim 1, wherein each of the securing means extends through a lateral wall of the susceptor and into the bottom and the top wall, respectively, for securing these walls to each other.

5. A susceptor according to claim 1, wherein the susceptor wall pieces are made of graphite.

6. A susceptor according to claim 1, wherein the susceptor wall pieces are coated by a protective SiC-layer.

7. A susceptor according to claim 1, wherein a first plate made of SiC, is placed to cover said bottom wall and to extend between said lateral walls and said bottom wall and a second plate made of SiC, is placed directly under said top wall to cover said top wall and to extend between said lateral walls and said top wall piece.

8. A susceptor according to claim 7, further including at least two channels, each adapted to receive at least one substrate for the growth of at least one said object, each channel being delimited by two lateral wall pieces, a top wall piece and a bottom wall piece, and wherein a wall piece separating two adjacent channels forms the bottom wall for one channel and the top wall for the other channel.

9. A susceptor according to claim 8, wherein said first and second plates are placed on said bottom wall piece and directly under said top wall piece between two lateral wall pieces and the respective top and bottom wall of each channel in the susceptor.

10. A susceptor according to claim 1, wherein said channel is adapted to receive a substrate on which an object of SiC is to be epitaxially grown.

11. A susceptor according to claim 1, wherein said susceptor wall pieces are made of a material being well treatable by a Rf-field radiating means.

12. A device for epitaxially growing objects made of one of SiC, a Group 3B-nitride and alloys thereof on a substrate, said device comprising:

1) a susceptor for receiving said substrate, said susceptor including a channel defined by susceptor walls and adapted to receive said substrate and through which a source material for the growth is to be fed;

2) said susceptor walls including plurality of separate wall pieces defining a top wall, a bottom wall and lateral walls;

3) means for securing said wall pieces to each other to form said susceptor;

4) heating means for heating said susceptor; and 5) at least one SiC plate inserted to cover at least one of said top and bottom walls and to extend between and separate said lateral walls and said at least one of said top and bottom walls.

* * * * *